United States Patent
Kong

(10) Patent No.: US 8,654,597 B2
(45) Date of Patent: Feb. 18, 2014

(54) DEFECTIVE MEMORY CELL ADDRESS STORAGE CIRCUIT AND REDUNDANCY CONTROL CIRCUIT INCLUDING THE SAME

(75) Inventor: Yong-Ho Kong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 265 days.

(21) Appl. No.: 13/191,935

(22) Filed: Jul. 27, 2011

(65) Prior Publication Data

US 2012/0155202 A1 Jun. 21, 2012

(30) Foreign Application Priority Data

Dec. 16, 2010 (KR) ........................ 10-2010-0128929

(51) Int. Cl.
*G11C 29/00* (2006.01)
(52) U.S. Cl.
USPC .......................................................... 365/200
(58) Field of Classification Search
USPC .................. 365/200, 201, 210.1, 225.7
See application file for complete search history.

(56) References Cited

U.S. PATENT DOCUMENTS

| 6,757,852 | B1* | 6/2004 | Ghassemi et al. | 714/711 |
| 8,059,477 | B2* | 11/2011 | Yoon | 365/200 |
| 2005/0237830 | A1* | 10/2005 | Kim et al. | 365/200 |
| 2009/0168570 | A1* | 7/2009 | Park | 365/200 |

FOREIGN PATENT DOCUMENTS

| JP | 2002-184179 | 6/2002 |
| JP | 2002-259208 | 9/2002 |
| KR | 1019990056803 | 7/1999 |
| KR | 1020030078347 | 10/2003 |

OTHER PUBLICATIONS

Office Action issued by the Korean Intellectual Property Office on Mar. 29, 2012.
Notice of Allowance issued by the Korean Intellectual Property Office on Feb. 8, 2013.

* cited by examiner

*Primary Examiner* — Toan Le
(74) *Attorney, Agent, or Firm* — IP & T Group LLP

(57) ABSTRACT

A fail address storage circuit includes a fail address storage unit configured to store a fail address and a discrimination information storage unit configured to store information indicating whether a value stored in the fail address storage unit is a row address or column address.

10 Claims, 3 Drawing Sheets

| FIRST FUSE | SECOND FUSE | OPERATION MODE | REN | CEN |
|---|---|---|---|---|
| NO CUT | NO CUT | REDUNDANCY OPERATION NOT PERFORMED | DEACTIVATED | DEACTIVATED |
| NO CUT | CUT | COLUMN REDUNDANCY OPERATION | DEACTIVATED | ACTIVATED |
| CUT | NO CUT | ROW REDUNDANCY OPERATION | ACTIVATED | DEACTIVATED |
| CUT | CUT | ROW REDUNDANCY OPERATION | ACTIVATED | DEACTIVATED |

DEFECTIVE MEMORY CELL ADDRESS STORAGE CIRCUIT AND REDUNDANCY CONTROL CIRCUIT INCLUDING THE SAME

CROSS-REFERENCE TO RELATED APPLICATIONS

The present application claims priority of Korean Patent Application No. 10-2010-0128929, filed on Dec. 16, 2010, which is incorporated herein by reference in its entirety.

BACKGROUND

1. Field

Exemplary embodiments of the present invention relate to a defective memory cell address storage circuit and a redundancy control circuit including the same.

2. Description of the Related Art

When a semiconductor memory device includes a few defective memory cells or even a defective memory cell, the semiconductor memory device may be discarded as a defective product. Here, to improve yields, redundancy technology may be applied by using preliminary memory cells that are previously installed in a semiconductor memory cell.

After a wafer fabrication process is completed, a defective memory cell is detected through a test, and a fuse is cut to perform a programming operation. The address information of such as a defective memory cell (that is, an address for which the fuse was cut) is stored to prepare to replace the defective memory cell with a redundancy memory cell.

FIG. 1 is a diagram of a conventional redundancy control circuit.

Referring to FIG. 1, the conventional redundancy control circuit includes a row address storage unit 110, a column address storage unit 120, a row address comparison unit 130, a column address comparison unit 140, and a redundancy control unit 150.

Hereafter, referring to FIG. 1, the operation of the conventional redundancy control circuit is described.

The row address storage unit 110 and the column address storage unit 120 include a plurality of fuses. Here, whether a fail address (e.g., an address for a defective memory cell) is actually stored among the plurality of fuses or not is stored in an enable fuse of the plurality of fuses. For example, when the enable fuse is cut, the value of the fail address is stored in the other fuses, and when the enable fuse is not cut, the value of the fail address is not stored in the other fuses. The other fuses store the respective codes of the fail address.

Hereafter, a row redundancy operation will be described.

The row address storage unit 110 is configured to store a row address corresponding to a memory cell which is to be replaced by a redundancy memory cell. Since a fail address is stored, the enable fuse is cut. Hereafter, the value stored in the row address storage unit 110 is referred to as a row fail address FRA<0:N>.

The row address storage unit 110 outputs the row fail address FRA<0:N> stored therein. Furthermore, since the enable fuse is cut, a row enable signal REN is activated.

The row address comparison unit 130 is configured to compare an address RA<0:N> inputted from outside with the row fail address FRA<0:N> and generate comparison information RCMP<0:N>. The codes of the comparison information RCMP<0:N> are activated when the codes of the inputted address RA<0:N> are identical to the codes of the row fail address FRA<0:N>, respectively. For example, when the first code RA<0> of the inputted address is identical to the first code FRA<0> of the row fail address, the first code RCMP<0> of the comparison information is activated. Therefore, when the inputted address RA<0:N> and the row fail address FRA<0:N> are completely identical to each other, all codes of the comparison information RCMP<0:N> are activated.

The redundancy control unit 150 is configured to control a row redundancy operation in response to the row enable signal REN and the comparison information RCMP<0:N>. For this operation, when both of the row enable signal REN and the comparison information RCMP<0:N> are activated, that is, when the row enable signal REN is activated and the inputted address RA<0:N> and the row fail address FRA<0:N> are identical to each other, the redundancy control unit 150 activates a row redundancy control signal RCON. The row redundancy control signal RCON is activated, a replaced redundancy word line is enabled instead of an original word line corresponding to the inputted address RA<0:N>.

A column redundancy operation may be performed in the same way as the row redundancy operation, except that an address inputted from outside is a column address CA<0:N>. When a column redundancy control signal CCON is activated, the column redundancy operation is performed.

The conventional redundancy control circuit includes a plurality of row/column address storage units 110 and 120 for storing a plurality of row/column addresses. As described above, however, the row address storage units 110 and the column address storage units 120 are controlled independently from each other. Therefore, the row address storage units 110 and the column address storage units 120 are not used interchangeably with each other. For example, it may be assumed that defective memory cell addresses are stored in all the row address storage units 110. Then, although extra column address storage units 130 remain, a defective memory cell address for a row redundancy operation may not be stored in the column address storage units 130. Therefore, the redundancy operation is less efficient.

SUMMARY

An embodiment of the present invention is directed to a redundancy control circuit which is capable of increasing the flexibility of a redundancy operation by storing a row address or column address in a fail address storage unit.

In accordance with an embodiment of the present invention, a fail address storage circuit includes: a fail address storage unit configured to store a fail address; and a discrimination information storage unit configured to store information indicating whether a value stored in the fail address storage unit is a row address or column address.

In accordance with another embodiment of the present invention, a redundancy control circuit includes: a fail address storage unit configured to store a fail address; an address determination unit configured to determine whether a value stored in the fail address storage unit is a row address or column address; an address comparison unit configured to compare the value stored in the fail address storage unit with an input address; and a redundancy control unit configured to control a redundancy operation in response to the determination result of the address determination unit and the comparison information.

In accordance with further embodiment of the present invention, a fail address storage circuit includes: a fail address storage unit configured to store a fail address; and a discrimination information storage unit configured to store information indicating whether the fail address is a row address or column address.

DETAILED DESCRIPTION

Figure 1:
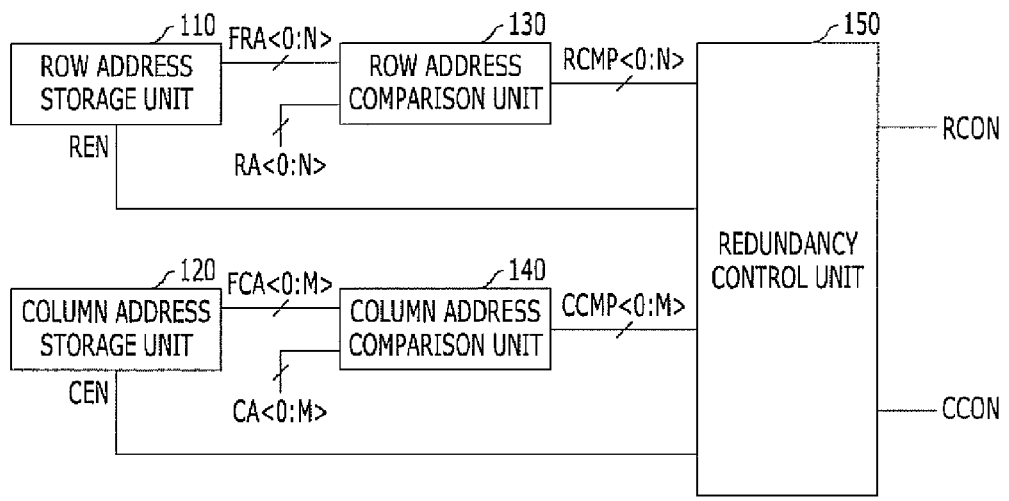
FIG. 1 is a configuration diagram of a conventional redundancy control circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
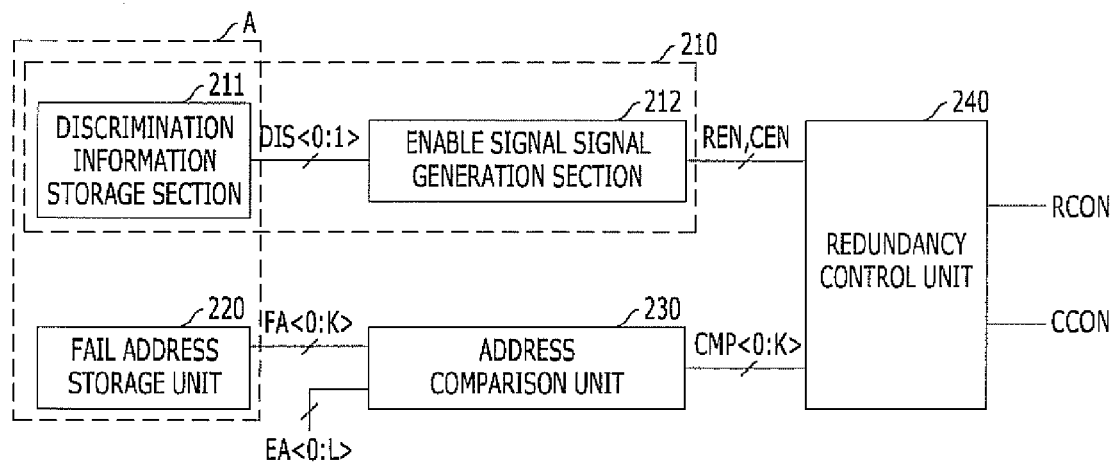
FIG. 2 is a configuration diagram of a redundancy control circuit in accordance with an embodiment of the present invention.

FIG. 2 is a configuration diagram of a redundancy control circuit in accordance with an embodiment of the present invention.

Referring to FIG. 2, the redundancy control circuit includes a defect memory cell address storage unit 220, an address determination unit 210, an address comparison unit 230, and a redundancy control unit 240. The address determination unit 210 includes a discrimination information storage section 211 and an enable signal generation section 212.

Hereafter, referring to FIG. 2, the operation of the redundancy control circuit is described. It is assumed that the number of a row address is greater than the number of a column address by 'X' in this embodiment. For example, the number of a row address is set to (K+1), and the number of a column address is set to (K+1-X).

When a memory device is tested, a row address corresponding to a word line having a fail (e.g., a word line is defective or connected to a defective memory cell) or a column address corresponding to a bit line having a fail is stored in the fail address storage unit 220. Hereafter, the row address or column address having a fail is referred to as a fail address FA<0:K>. At this time, the fail address storage unit 220 uses a storage device which maintains data stored therein even though power supply is cut off. The storage device may include a fuse, an anti-fuse, a read only memory (ROM) and etc.

Throughout this disclosure, when a word line/bit line is said to have a fail, a memory cell coupled to the word line/bit line has a fail or the word line/bit line itself has a fail.

When the fail address FA<0:K> is stored in the fail address storage unit 220 during a test, information on whether the fail address FA<0:K> is a row address or column address is simultaneously stored in the discrimination information storage section 211. Hereafter, the information is referred to as discrimination information DIS<0:1>. The discrimination information DIS<0:1> may also include information on whether the fail address FA<0:K> is stored in the fail address storage unit 220. Similar to the fail address storage unit 220, the discrimination information storage section 211 may include a storage device which maintains data stored therein even though power supply is cut off.

When an address and a command for a read or write operation are inputted together from outside, the address determination unit 210 determines whether the fail address FA<0:K> is stored in the fail address storage unit 220 or not and whether the fail address FA<0:K> is a row address or column address, in response to the discrimination information DIS<0:1> stored in the discrimination information storage section 211.

When it is determined that the fail address FA<0:K> is not stored in the fail address storage unit 220, both of a row enable signal REN and a column enable signal CEN are deactivated. When the fail address FA<0:K> stored in the fail address storage unit 220 is a row address, the row enable signal REN is activated to a high level, and when the fail address FA<0:K> stored in the fail address storage unit 220 is a column address, the column enable signal CEN is activated to a high level.

The address comparison unit 230 is configured to compare the fail address FA<0:K> stored in the fail address storage unit 220 with an address EA<0:L> inputted from outside and output comparison information CMP<0:K> representing whether the fail address FA<0:K> and the address EA<0:L> are identical to each other or not. Here, L may differ depending on whether the inputted address is a row address or column address. For example, when the input address EA<0:L> is a row address, L is set to K (L=K), and when the input address EA<0:L> is a column address, L is set to K-X (L=K-X).

The respective codes of the comparison information CMP<0:K> are activated when the codes of the input address EA<0:L> are identical to the codes of the fail address FA<0:K>, respectively, or deactivated when the codes of the input address EA<0:L> are not identical to the codes of the fail address FA<0:K>, respectively, where the comparison is made for each pair of corresponding codes. For example, when the code FA<0> is equal to the code EA<0>, the code CMP<0> is activated, and when the code FA<0> is different from the code EA<0>, the code CMP<0> is deactivated.

The redundancy control unit 240 is configured to determine whether or not to perform a redundancy operation.

When the fail address FA<0:K> stored in the fail address storage unit 212 is a row address, the row enable signal REN is activated. In this case, the redundancy control unit 240 activates a row redundancy signal RCON to a low level to perform a row redundancy operation, when the codes CMP<0> to CMP<K> are activated.

When the fail address FA<0:K> stored in the fail address storage unit 212 is a column address, the column enable signal CEN is activated. In this case, the redundancy control unit 240 activates (e.g., generates a low level logic signal) a column redundancy signal CCON to perform a column redundancy operation, when the codes CMP<0> to CMP<K-X> are activated regardless of the codes CMP<K+1-X> to CMP<K>.

More specifically, when the row enable signal REN is activated, the redundancy control unit 240 activates the row redundancy signal RCON in response to the codes CMP<0> to CMP<K>, and when the column enable signal CEN is activated, the redundancy control unit 240 activates the column redundancy signal CCON in response to the codes CMP<0> to CMP<K-X>.

Throughout this disclosure, a redundancy operation refers to an operation of enabling a redundancy word line/bit line instead of an original word line/bit line, when a corresponding row/column address is inputted in case the original word line/bit line corresponding to the inputted row/column address has a fail and is to be replaced with the redundancy word line/bit line.

In accordance with the embodiment of the present invention, the fail address FA<0:K> is stored in the fail address storage unit 220, regardless of whether the fail address FA<0:K> is a row address or column address. Furthermore, the discrimination information DIS<0:1> for determining whether the fail address FA<0:K> is a row address or column address is stored in the discrimination information storage section 211, where the information indicates the type of the fail address FA<0:K> stored in the fail address storage circuit 'A.'

A redundancy control circuit in accordance with an exemplary embodiment of the present invention may store any of row and column addresses in the fail address storage unit 220. Therefore, the fail address storage unit 220 whose number is limited in a memory device is efficiently used.

According to an example, the number of row address storage units 110 for storing row addresses in the conventional redundancy circuit in FIG. 1 may be set to five and the number of column address storage units 120 for storing column addresses may be set to three. At this time, when the number of row addresses corresponding to word lines to be replaced with redundancy word lines is four and the number of column addresses corresponding to bit lines to be replaced with redundancy bit lines is four, the number of column address storage units 120 in the conventional redundancy control circuit is short by one. Therefore, the entire memory device is not used.

According to an exemplary embodiment of the present invention, however, when eight fail address storage units 220 are provided and the discrimination information storage section 211 stores discrimination information on whether fail addresses are row addresses or column addresses, the row addresses corresponding to word lines to be replaced with redundancy word lines and the column addresses corresponding to bit lines to be replaced with redundancy bit lines may be all stored in the same situation.

Figure 3:
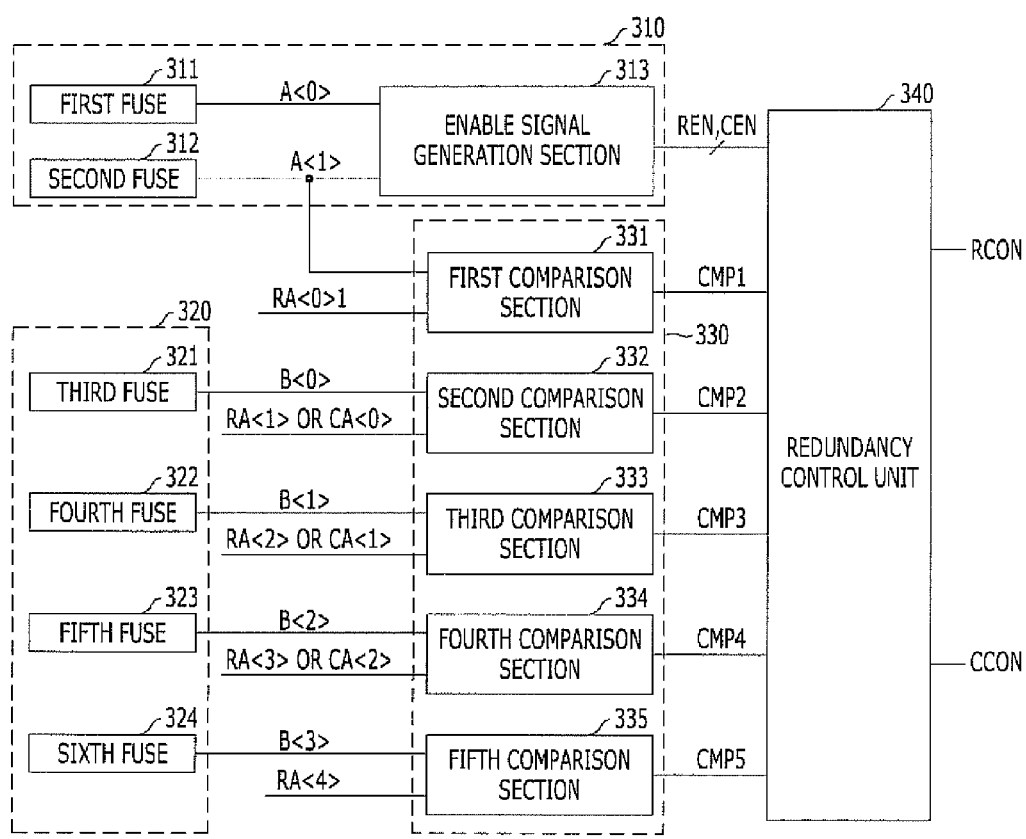
FIG. 3 is a configuration diagram of a redundancy control circuit including fuses in accordance with another embodiment of the present invention.
Figure 4:
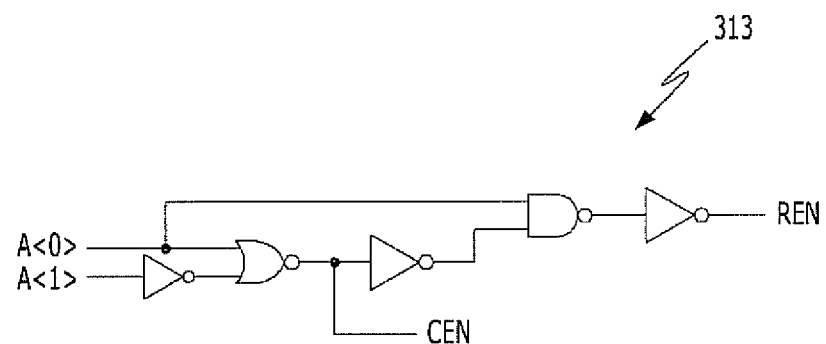
FIG. 4 includes a configuration diagram of an enable signal generation section and a table illustrating the operation thereof.

FIG. 3 is a configuration diagram of a redundancy control circuit including fuses in accordance with another embodiment of the present invention. FIG. 4 includes a configuration diagram of an enable signal generation section 313 and a table illustrating the operation thereof.

Referring to FIG. 3, the redundancy control circuit includes a fail address storage unit 320, an address determination unit 310, an address comparison unit 330, and a redundancy control unit 340. The address determination unit 310 includes a discrimination information storage section 311 and 312 and an enable signal generation section 313.

Hereafter, referring to FIGS. 3 and 4, the operation of the redundancy control circuit is described.

The discrimination information storage section 311 and 312 may include one or more fuses. The one or more fuses are configured to store information on whether a fail address is stored in the fail address storage unit 320 or not and information for determining whether the stored address is a row address or column address in case the fail address is stored.

The fail address storage unit 320 includes a plurality of fuses 321 to 324. The plurality of fuses 321 to 324 are configured to store the respective codes of the fail address.

Hereafter, a case in which the discrimination information storage section includes first and second fuses 311 and 312 and the fail address storage unit 320 includes third to sixth fuses 321 to 324 is described. Furthermore, a case in which the number of a row address is five and the number of a column address is three is described.

Referring to the table of FIG. 4, when the first fuse 311 of the discrimination information storage section 311 is cut, the values stored in the second to sixth fuses 312 and 321 to 324 become a row address. Therefore, the enable signal generation section 313 activates a row enable signal REN.

When the fail address is a row address during a test, the first fuse 311 may store information representing that the fail address is a row address. Therefore, one of the codes of the fail address is stored in the remaining second fuse 312.

The first to fifth comparison section 331 to 335 are configured to compare the respective codes A<1> and B<0> to B<3> of the fail address with the respective codes RA<0> to RA<4> of an inputted address and generate a plurality of comparison signals CMP1 to CMP5. At this time, when the fail address A<1> and B<0:3> as a group is identical to the input address RA<0:4>, all the comparison signals CMP1 to CMP5 are activated.

When the row enable signal REN is activated and the fail address A<1> and B<0:3> as a group is identical to the input address RA<0:4> such that the comparison signals CMP1 to CMP5 are activated, the redundancy control unit 340 performs a row redundancy operation on the corresponding address. Here, the row redundancy operation refers to an operation of enabling a redundancy word line instead of an original word line, when the corresponding address RA<0:4> is inputted and the original word line corresponding to the inputted address RA<0:4> has a fail and is to be replaced with the redundancy word line.

Referring to the table of FIG. 4, when the first fuse 311 of the discrimination information storage section 310 is not cut and the second fuse 312 is cut, the values stored in the third to fifth fuses 321 to 323 become a column address. Therefore, the enable signal generation section 313 activates the column enable signal CEN.

When the fail address is a column address during a test, information representing that the fail address is a column address is to be stored in the first and second fuses 311 and 312. Therefore, the fail address B<0:2> is stored in the third fuse 321 to the sixth fuse 324.

The second to fourth comparison sections 332 to 334 compare the respective codes B<0> to B<2> of the fail address with the respective codes CA<0> to CA<2> of the inputted address, and generate a plurality of comparison signals CMP2 to CMP4. At this time, when the fail address B<0:2> as a group is identical to the input address CA<0:2>, the second to fourth comparison signals CMP2 to CMP4 are activated.

When the column enable signal CEN is activated and the fail address B<0:2> as a group is identical to the input address CA<0:2> such that the second to fourth comparison signals CMP2 to CMP4 are activated, the redundancy control unit 340 performs a column redundancy operation on the corresponding address. Here, the column redundancy operation refers to an operation of activating a redundancy bit line instead of an original bit line, when the corresponding address CA<0:2> is inputted and the original bit line corresponding to the inputted address CA<0:2> has a fail and is to be replaced with the redundancy bit line.

Here, the redundancy control unit 340 activates the row redundancy signal RCON in response to the first to fifth comparison signals CMP1 to CMP5, when the row enable signal REN is activated, and activates the column redundancy signal CCON in response to the second to fourth comparison signals CMP2 to CMP4 when the column enable signal CEN is activated.

When both of the first and second fuses 311 and 312 are not cut, it indicates that the fail address is not stored. Therefore, both of the enable signals REN and CEN are deactivated, and a redundancy operation is not performed.

The enable signal generation section 313 activates or deactivates one of the row enable signal REN and the column enable signal CEN by using the value A<0> stored in the first fuse 311 and the value A<1> stored in the second fuse 312 through logic gates illustrated in FIG. 4.

When the fuses 311 and 312 are cut, the codes A<0> and A<1> are activated, and when the fuses 311 and 312 are not cut, the codes A<0> and A<1> are deactivated. Therefore, according to the table of FIG. 4, when none of the first and second fuses 311 and 312 is cut, both the codes A<0> and A<1> are deactivated to deactivate both the enable signals REN and CEN. When the first fuse 311 is not cut and the second fuse 312 is cut, the code A<0> is deactivated and the code A<1> is activated. In this case, the row enable signal REN is deactivated, and the column enable signal CEN is activated. When the first fuse 311 is cut and the second fuse 312 is not cut, the code A<0> is activated, and the code A<1> is deactivated. In this case, the row enable signal REN is activated, and the column enable signal CEN is deactivated. When the first fuse 311 is cut and the second fuse 312 is cut, the code A<0> is activated and the code A<1> is deactivated. In this case, the row enable signal REN is activated, and the column enable signal CEN is deactivated.

In reference to FIG. 3, a case in which the number of codes for the row address is larger than the number of codes for the column address is just an example. Other examples are possible. For example, a number of codes for the row address may be smaller than a number of codes for the column address. In this case, information that a fail address is a column address may be stored in the first fuse 311, and the fail address may be stored in the second to sixth fuses 312 and 321 to 324. Furthermore, the number of fuses may be adjusted according to the number of the address. At this time, information that the fail address is a column address may be stored in the first fuse 311 and the second fuse 312, and the fail address may be stored in the third to sixth fuses 321 to 324.

According to an exemplary embodiment, one or more fuse may be used to store the row address or column address.

In accordance with the embodiments of the present invention, the redundancy control circuit may discriminate whether a value stored in the fail address storage unit is a row address or column address, and may store either the row address or the column address in the fail address storage unit. Therefore, the flexibility of the redundancy operation may be increased.

While the present invention has been described with respect to the specific embodiments, it will be apparent to those skilled in the art that various changes and modifications may be made without departing from the spirit and scope of the invention as defined in the following claims.

What is claimed is:

1. A fail address storage circuit comprising:
a fail address storage unit configured to store a fail address; and
a discrimination information storage unit configured to store information indicating whether a value stored in the fail address storage unit is a row address or column address,
wherein the discrimination information storage unit comprises first and second fuses and,
wherein when the first fuse is cut, the value stored in the fail address storage unit comprises the row address and the second fuse stores a code of the row address and when the first fuse is not cut and the second fuse is cut, the value stored in the fail address storage unit comprises the column address.

2. The fail address storage circuit of claim 1, wherein the discrimination information storage unit is configured to store information indicating whether the fail address is stored in the fail address storage unit or not.

3. The fail address storage circuit of claim 1, wherein the fail address storage unit comprises a plurality of fuses.

4. A redundancy control circuit comprising:
a fail address storage unit configured to store a fail address;
an address determination unit configured to determine whether a value stored in the fail address storage unit is a row address or column address;
an address comparison unit configured to compare the value stored in the fail address storage unit with an input address; and
a redundancy control unit configured to control a redundancy operation in response to the determination result of the address determination unit and the comparison information,
wherein the address determination unit comprises:
a discrimination information storage section configured to store information on whether the value stored in the fail address storage unit is the row address or the column address; and
an enable signal generation section configured to generate a row enable signal when the value stored in the fail address storage unit is the row address and generate a column enable signal when the value stored in the fail address storage unit is the column address in response to the information stored in the discrimination information storage section,
wherein the discrimination information storage section comprises first and second fuses and wherein,
when the first fuse is cut, the value stored in the fail address storage unit comprises the row address and the second fuse stores a code of the row address and when the first fuse is not cut and the second fuse is cut, the value stored in the fail address storage unit comprises the column address.

5. The redundancy control circuit of claim 4, wherein the address determination unit is configured to determine whether the fail address is stored in the fail address storage unit or not.

6. The redundancy control circuit of claim 4, wherein the redundancy control unit is configured to control a row redundancy operation when the row enable signal is activated and the value stored in the fail address storage unit is equal to the input address as the comparison result of the address comparison unit and control a column redundancy operation when the column enable signal is activated and the value stored in the fail address storage unit is equal to the input address as determined from the comparison result of the address comparison unit.

7. The redundancy control circuit of claim 4, wherein the fail address storage unit comprises a plurality of fuses.

8. A fail address storage circuit comprising:
a fail address storage unit configured to store a fail address; and
a discrimination information storage unit configured to store information indicating whether the fail address is a row address or column address,
wherein the discrimination information storage unit comprises first and second fuses and,
wherein when the first fuse is cut, the fail address comprises the row address and the second fuse stores a code of the row address and when the first fuse is not cut and the second fuse is cut, the fail address comprises the column address.

9. The fail address storage circuit of claim 8, wherein the discrimination information storage unit is configured to store information indicating whether the fail address is stored in the fail address storage unit or not.

10. The fail address storage circuit of claim 8, wherein the fail address storage unit comprises a plurality of fuses.

* * * * *